United States Patent
Nguyen et al.

(10) Patent No.: US 6,727,759 B2
(45) Date of Patent: Apr. 27, 2004

(54) COLLECTIVE AUTOMATIC GAIN CONTROL

(75) Inventors: Huey M. Nguyen, San Jose, CA (US); Benedict C. Lau, San Jose, CA (US); Leung Yu, San Jose, CA (US); Jade M. Kizer, Mountain View, CA (US); Roxanne T. Vu, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/444,175

(22) Filed: May 23, 2003

(65) Prior Publication Data

US 2003/0218504 A1 Nov. 27, 2003

Related U.S. Application Data

(62) Division of application No. 09/891,577, filed on Jun. 25, 2001, now Pat. No. 6,600,374.

(51) Int. Cl.[7] .............................................. H03G 3/10
(52) U.S. Cl. ..................... 330/279; 330/136; 330/140; 455/245.1
(58) Field of Search ................................ 330/279, 136, 330/140, 85, 84, 124 R, 295; 455/245.1, 245.2

(56) References Cited

U.S. PATENT DOCUMENTS

| | | | |
|---|---|---|---|
| 4,186,377 A | | 1/1980 | Barabino |
| 4,835,490 A | * | 5/1989 | Mazzucco et al. .......... 330/285 |
| 5,117,201 A | * | 5/1992 | Luther ........................ 330/279 |
| 5,469,127 A | | 11/1995 | Hulick et al. |
| 6,369,635 B2 | * | 4/2002 | Weiss et al. ................ 327/330 |

* cited by examiner

Primary Examiner—Henry Choe
(74) Attorney, Agent, or Firm—Lee & Hayes, PLLC

(57) ABSTRACT

A data receiver includes group envelope detection circuitry that produces a group envelope voltage. The group envelope voltage represents the average envelope of a plurality of amplified data signals. Associated feedback adjusts the gains applied to each data signal to minimize any difference between the group envelope voltage and a reference voltage. The reference voltage is preferably the envelope of a clock signal associated with the data signals.

23 Claims, 9 Drawing Sheets

COLLECTIVE AUTOMATIC GAIN CONTROL

CROSS REFERENCE(S) TO OTHER APPLICATION(S)

This U.S. Nonprovisional Application for Letters Patent is a divisional application of co-pending U.S. Nonprovisional Application for Letters Patent assigned Application No. 09/891,577 and filed Jun. 25, 2001 now U.S. Pat. No. 6,600,374.

TECHNICAL FIELD

The invention relates to automatic gain control in signal receivers.

BACKGROUND

High-speed digital systems such as memory systems sometimes use a form of I/O in which data is defined by a differential voltage signal. A differential voltage signal comprises a pair of complementary signals. A high logic level is represented by setting a first of the signals to a relatively high voltage and the second of the signals to a relatively low voltage. A low logic level is represented by switching the two voltages, so that the first signal has a relatively lower voltage than the second signal. Differential signaling is advantageous because of its relative immunity to noise and other signal degradations. A disadvantage of differential signaling is that it requires two signal lines for every data bit.

In order to reduce the number of data signaling lines, single-ended signaling is often used in high speed circuits. This particular type of signaling is non-differential, although it is sometimes referred to as "pseudo differential" signaling. Pseudo differential signaling specifies logic levels as voltages relative to a common, intermediate reference voltage. For example, a signal might be defined to represent a high logic level whenever its voltage is above the reference voltage, and to represent a low logic level whenever its voltage is below the reference voltage. This type of signaling requires fewer conductors than differential signaling, because a single reference line can be used in conjunction with many data signal lines. Although this type of signaling is less immune to signal degradation than differential signaling, it represents a distinct improvement over signaling systems in which signal levels are specified in terms of absolute voltages, rather than in relation to a specified reference voltage. Typically, a reference voltage signal is transmitted alongside data signals so that the same sources of noise will affect both the reference signal and the data signals. This tends to cancel the effects of the noise and provides some degree of noise immunity.

Regardless of whether signals are differential or non-differential, it is frequently desirable to perform some sort of signal buffering and/or conditioning at the receiving device. This is typically accomplished by a data receiver corresponding to each incoming signal line.

FIG. 1 shows a data receiver 10 that buffers an incoming data signal $D_{IN}$ to form a buffered or amplified internal data signal $D_{OUT}$. This circuit uses automatic gain control to achieve a desired voltage amplitude at $D_{OUT}$.

Data receiver 10 comprises a variable gain amplifier 12 that receives $D_{IN}$ and produces $D_{OUT}$. The receiver also has an envelope detector 14 that detects the voltage amplitude of signal $D_{OUT}$. An envelope detector or peak detector is a well-known type of circuit whose output voltage tracks the peak or swing voltages of a modulating input voltage such as a data signal.

FIG. 2 shows a simplified example of an envelope detector 14, comprising an FET control transistor M, a tracking capacitance C, a charging current source $I_{CH}$, and a discharging current source $I_{DIS}$. Transistor M is controlled by data signal $D_{OUT}$ to charge capacitance C whenever $D_{OUT}$ is relatively high. When the voltage $V_{ENV}$ on capacitance C approaches the voltage of $D_{OUT}$, the transistor shuts off because of the reduced gate-to-source voltage of the transistor in this condition. Thus, the transistor charges capacitance C to approximately the "high" logic level of $D_{OUT}$. The size of current source $I_{CH}$ determines the "attack" rate of the envelope detector—the rate at which output voltage $V_{ENV}$ will climb in response to an increased voltage at $D_{OUT}$. Current source $I_{DIS}$ is connected to slowly discharge capacitance C, to account for situations in which the peak levels of $D_{IN}$ decrease over time. The size of current source $I_{DIS}$ determines the "decay" rate of the envelope detector—the rate at which output voltage $V_{ENV}$ will fall in response to a decreased input voltage $D_{OUT}$. $I_{DIS}$ is chosen to be small enough so that the voltage at $D_{OUT}$ will remain close to its peak value between peaks that occur in $D_{IN}$.

If appropriate sizes are selected for current sources $I_{CH}$ and $I_{DIS}$, an envelope detector can be configured to produce an output that closely tracks the peak voltages of a data signal. Although the envelope detector of FIG. 2 is configured to detect positive signal peaks, the circuit can be easily altered to detect negative peaks in an input signal.

Referring again to FIG. 1, envelope detector 14 is configured to determine and track the peak voltage of output signal $D_{OUT}$, and to produce a voltage signal $V_{ENV}$ representing this peak voltage. A feedback component 20 receives $V_{ENV}$ and compares it to a supplied reference amplitude $V_{AMP}$. The output of feedback component 20 is connected to the gain control of amplifier 12, forming a feedback loop that operates to minimize any difference between the peak output $V_{ENV}$ of signal $D_{OUT}$ and the supplied amplitude reference $V_{AMP}$. In other words, this circuit sets the gain of amplifier 12 so that the peak voltage of output $D_{OUT}$ is approximately equal to the voltage of $V_{AMP}$. In implementation, feedback component 20 is a $g_m$ stage whose output increases or decreases depending on the relative values of its inputs.

FIG. 3 shows data receiver 10, with the generic representation of amplifier 12 of FIG. 1 being replaced by a more detailed implementation of a differential amplifier circuit. Such a differential amplifier is typically used in conjunction with an input an input data signal $D_{IN}$ that is specified relative to an intermediate reference voltage $V_{REF}$, which is relatively constant. The differential amplifier produces a differential voltage output $D_{OUT}$ having + and − outputs.

The differential amplifier comprises a differential pair of FET transistors $M_2$ and $M_3$, whose sources are connected in common. The drains of $M_2$ and $M_3$ form the high and low outputs of differential voltage output signal $D_{OUT}$, and are connected through respective loads $R1_{LOAD}$ and $R2_{LOAD}$ to a high supply voltage $V_{dd}$. The gates of $M_2$ and $M_3$ are connected respectively to $D_{IN}$ and $V_{REF}$. The sources of $M_2$ and $M_3$ are connected in common through a biasing current source $I_{BIAS}$ to a low supply voltage $V_{ss}$.

The input of envelope detector 14 is connected to the positive side of differential output $D_{OUT}$. The output of feedback component 20 controls current source $I_{BIAS}$, which in turn controls the gain of the amplifier circuit. Feedback component 20 receives the output of envelope detector 14 and the amplitude reference $V_{AMP}$, and therefore establishes the gain of the amplifier circuit so that the peak voltage of output signal $D_{OUT}$ is approximately equal to $V_{AMP}$.

The circuits described above have been used with success in many situations. However, problems arise in certain situations. One problem arises from the use of automatic gain control and envelope detectors in situations where there are relatively long periods without a transition in the received data signal. For example, a relatively long period in which a data signal remains low results in a decaying envelope voltage, which in turn causes automatic gain control circuits to inappropriately increase circuit gains. Furthermore, in many cases it is challenging to determine the optimal amplitude of $D_{OUT}$. It is desirable to keep the amplitude as low as possible to reduce power consumption, but also to keep it as high as necessary to ensure accurate differentiation between high and low signals.

A further concern arises where a data signal is precisely timed relative to other signals. In cases such as this, it is important to maintain the relative timing between the two or more signals. However, variations in amplification can affect this timing. This problem arises, for example, with incoming signals that must exceed a certain threshold voltage in order for them to be resolved by receiving circuitry. In a situation like this, a signal having a relatively higher amplitude will be resolved more quickly than a signal having a relatively lower amplitude. Thus, differences in amplification between two signals will be perceived as timing differences by receiving circuitry.

Differences in duty cycles between two signals can also affect their relative timings as perceived by receiving circuitry. This problem can arise in situations where one signal is a true differential voltage signal and the other is a non-differential or pseudo-differential voltage signal. A differential voltage signal typically achieves very close to a 50% duty cycle, even after amplification. Non-differential signals, however, are often subject to disproportionate amplification with respect to the positive and sides of their waveforms. This is especially true in circuits where reduced supply voltages are employed in order to increase circuit speeds. In such circuits, current sources sometimes begin to operate below saturation typically reducing the amount of amplification applied to negative portions of waveforms. This has the effect of changing the duty cycle of an amplified signal, which also changes the relative point in time at which the signal crosses specified voltage thresholds.

The circuits and techniques described below address these and other issues.

DETAILED DESCRIPTION

The following description sets forth specific embodiments of circuits and techniques that incorporate elements recited in the appended claims. The embodiments are described with specificity in order to meet statutory requirements. However, the description itself is not intended to limit the scope of this patent. Rather, the inventors have contemplated that the claimed invention might also be embodied in other ways, to include different elements or combinations of storage elements similar to the ones described in this document, in conjunction with other present or future technologies.

Figure 4:
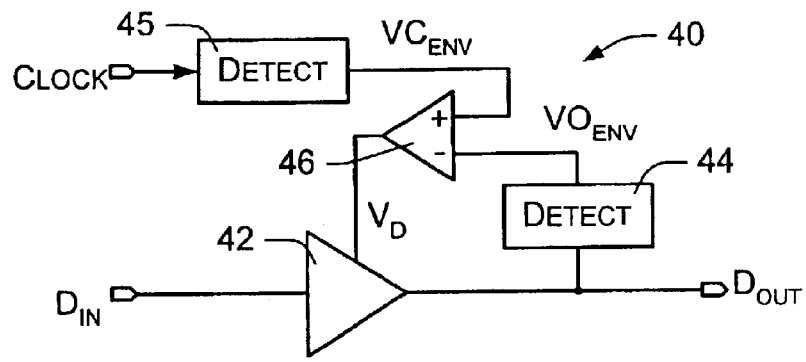
FIGS. 4 and 5 are schematic diagrams of an automatic gain control circuit in which the envelope of an amplified data signal is adjusted to equal the envelope of a related clock signal.

FIG. 4 shows one embodiment of a receiver circuit 40. The signal receiver receives a data signal $D_{IN}$ and produces an amplified data output signal $D_{OUT}$. The input data signal $D_{IN}$ is timed relative to a clock signal CLOCK.

Receiver circuit 40 comprises an amplifier 42 having a variable gain. The amplifier receives data input signal $D_{IN}$ and produces amplified data output signal $D_{OUT}$.

Figure 1:
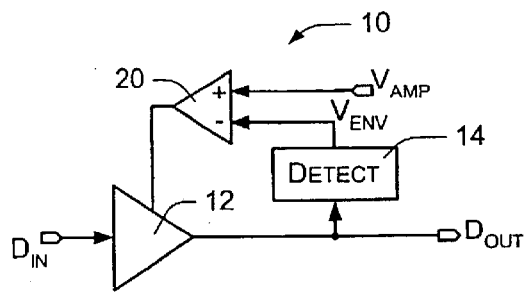
FIG. 1 is a schematic diagram of a prior art automatic gain control circuit.
Figure 2:
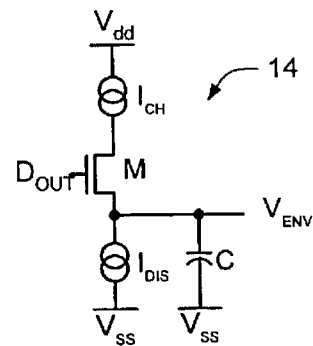
FIG. 2 is a schematic diagram of an envelope detection circuit.

Receiver circuit 40 implements automatic gain control with respect to its received data signal. The automatic gain control is implemented in part by signal envelope detection circuitry 44 that is responsive to the amplified data output signal $D_{OUT}$ to indicate an amplified signal envelope voltage $VO_{ENV}$. $VO_{ENV}$ tracks the voltage swing or peak voltage of $D_{OUT}$. FIG. 2 shows a simplified example of an appropriate envelope detector.

The automatic gain control of circuit 40 also comprises clock envelope detection circuitry 45 responsive to clock signal CLOCK to indicate a clock envelope voltage $VC_{ENV}$. $VC_{ENV}$ tracks the voltage swing or peak voltage of clock signal CLOCK. Again, FIG. 2 shows a simplified example of an appropriate envelope detector.

Automatic gain control circuitry further includes a feedback component 46 configured to adjust the gain of amplifier 42 as a function of the difference between the amplified signal envelope voltage $VO_{ENV}$ and the clock envelope voltage $VC_{ENV}$. More specifically, the feedback component has negative and positive inputs that receive $VO_{ENV}$ and $VC_{ENV}$, respectively, and in response produces a signal $V_D$ that changes depending on the relative values of $VO_{ENV}$ and $VC_{ENV}$. A component such as this is typically referred to as a $g_m$ stage. By connecting $V_D$ to the gain control input of amplifier 42, the amplifier gain is controlled in a way that reduces or minimizes any difference between $VO_{ENV}$ and $VC_{ENV}$, effectively setting the envelope, swing, or amplitude of $D_{OUT}$ to that of clock signal CLOCK.

This circuit is especially beneficial in systems where received data signals are single-ended, non-differential signals and that are timed relative to a differential voltage clock signal. Typically, the differential nature of the clock signal allows it to be conditioned more effectively than single-ended inputs and for its swing or amplitude to be set with precision to an optimum value. With the circuit of FIG. 4, the effort in conditioning the clock signal can be leveraged to determine and establish an optimum amplitude for buffered received data signals. Furthermore, setting the amplitude of received data signals to match that of the clock signal reduces timing or skew mismatches between the two types of signals, which might otherwise arise because of differing amounts of amplification being introduced in the different signals.

A further advantage of this circuit is that a reduced power mode can be implemented simply by reducing the amplitude of $VC_{ENV}$. Reducing the amplitude of $VC_{ENV}$ decreases the gain applied by amplifier 42, thereby reducing power consumption.

Figure 5:
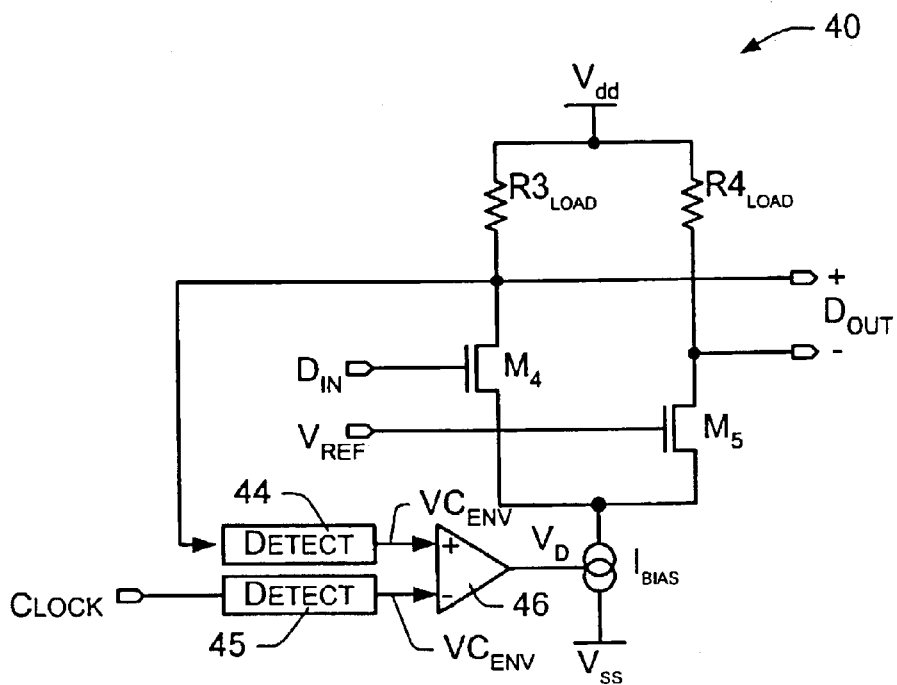

FIG. 5 shows an embodiment of data receiver 40 in which the generic representation of amplifier 42 in FIG. 4 has been replaced by a more detailed implementation of a differential amplifier circuit. Such a differential amplifier is appropriate for use in conjunction with an input data signal $D_{IN}$ that is specified it relative to a relatively constant, intermediate reference voltage $V_{REF}$. The differential amplifier produces a differential voltage output $D_{OUT}$ having + and − outputs.

The differential amplifier comprises a differential pair of FET transistors $M_4$ and $M_5$ whose sources are connected in common. The drains of $M_4$ and $M_5$ form the high and low outputs of differential voltage output signal $D_{OUT}$, and are connected through respective loads $R3_{LOAD}$ and $R4_{LOAD}$ to a high supply voltage $V_{dd}$. The gates of $M_4$ and $M_5$ are connected respectively to $D_{IN}$ and $V_{REF}$. The sources of $M_4$ and $M_5$ are connected in common through a biasing current source $I_{BIAS}$ to a low supply voltage $V_{ss}$.

The input of envelope detector 44 is connected to the positive side of differential output $D_{OUT}$. The input of envelope detector 45 is connected to one end of differential voltage clock signal CLOCK. The outputs of the detectors 44 and 45 are connected to the positive and negative inputs, respectively, of a feedback component 46, such as a $g_m$ stage as discussed above. The output of feedback component 46 controls current source $I_{BIAS}$, which in turn controls the gain of the amplifier circuit. This configuration establishes the gain of the amplifier circuit so that the peak voltage or swing of output signal $D_{OUT}$ is approximately equal to the peak voltage or swing of clock signal CLOCK.

Figure 6:
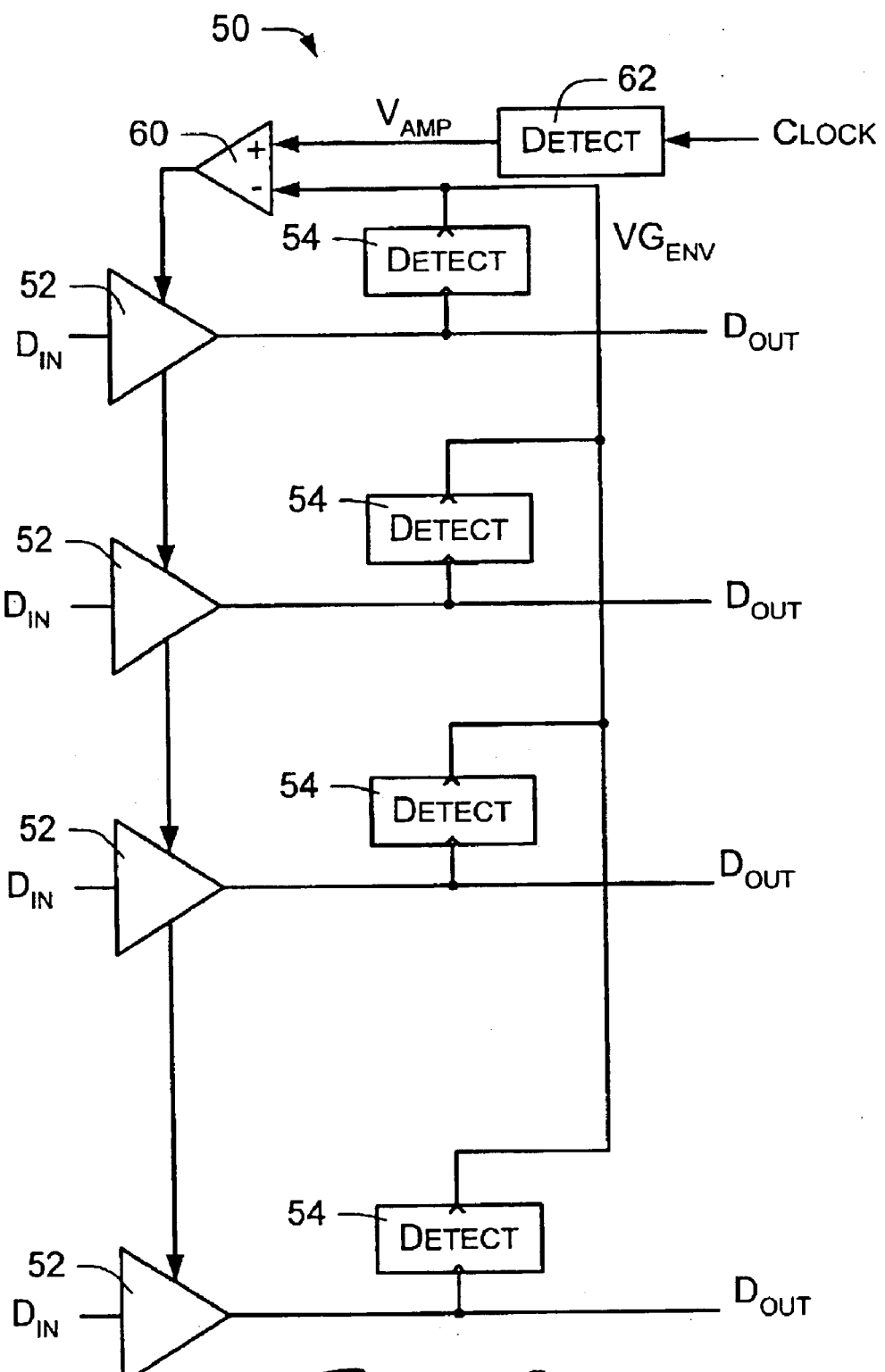
FIG. 6 is a schematic diagram of a receiver circuit employing group envelope detection techniques.

FIG. 6 shows another embodiment of a signal receiver, generally designated by reference numeral 50. In this example, signal receiver 50 receives a plurality of voltage data signals $D_{IN}$. For each data signal $D_{IN}$, signal receiver 50 has a corresponding amplifier 52. The amplifiers receive respective data signals $D_{IN}$ and produce corresponding amplified data signals $D_{OUT}$. The amplifiers have variable gains.

Receiver 50 has group envelope detection circuitry that is responsive to the collective amplified data signals $D_{OUT}$ to indicate a group envelope voltage. In this example, the group envelope detection circuitry comprises a plurality of individual envelope detectors 54 whose capacitive outputs are connected in common to form a group envelope voltage signal $VG_{ENV}$. In this configuration, the detection circuitry is responsive to peaks in any of data output signals $D_{OUT}$, and $VG_{ENV}$ generally tracks the most extreme peaks occurring at any moment on any of the data output signals.

Figure 7:
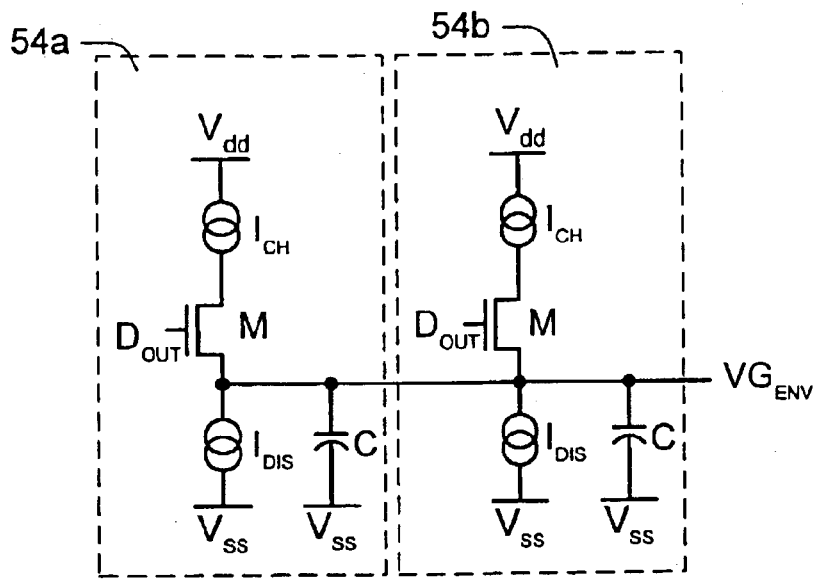
FIGS. 7 and 8 are schematic diagrams showing examples of group envelope detection circuitry.

The group envelope detection circuitry can be implemented in different ways. One implementation is shown in FIG. 7, where two envelope detectors 54a and 54b have outputs connected in common. Although FIG. 7 shows only two individual detectors, any number of detectors can be configured together in this manner. As discussed with reference to FIG. 2, each detector includes a FET control transistor M, a tracking capacitance C, a charging current source $I_{CH}$, and a discharging current source $I_{DIS}$. Each circuit works as already described with reference to FIG. 2. The capacitive outputs of all such individual circuits are connected in parallel to form $VG_{ENV}$.

Figure 8:
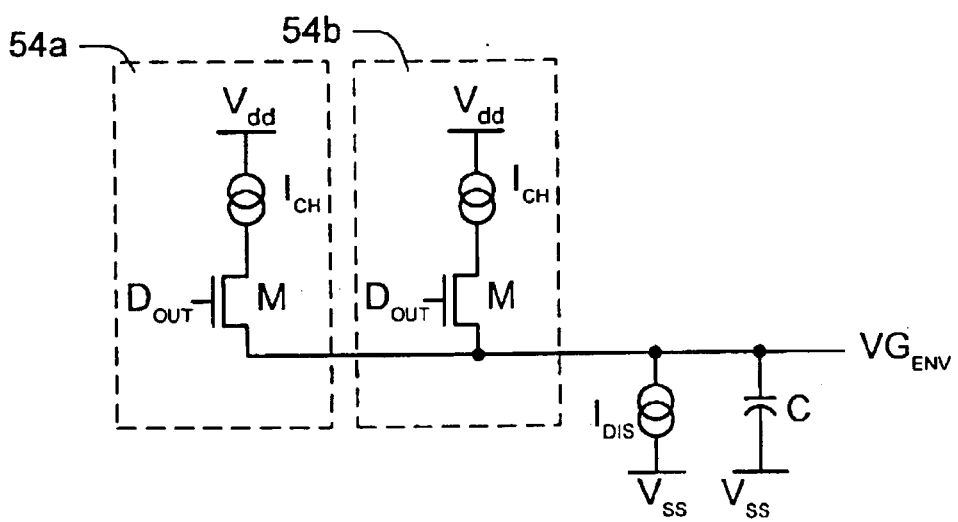

FIG. 8 shows another configuration, in which the tracking capacitance C and discharging current source $I_{DIS}$ are shared. There is a charging current source $I_{CH}$ and control transistor M associated with each data signal $D_{OUT}$. However, these components are connected in common to charge a single capacitance C. Again, any number of detectors can be connected together in such a fashion.

In either of these embodiments, it is possible to choose current source and capacitance sizes so that the overall circuit works in a roughly OR'ed fashion, reflecting the most extreme peak occurring at any moment on any of the data output signals, subject to attack and decay times that depend on the actual circuit implementation. The circuit output can alternatively be viewed as presenting the average of the peak voltages of the data signals $D_{OUT}$. Although these circuits as shown are appropriate for tracking positive envelopes or peaks, inverse implementations can easily be designed for detecting negative envelopes or peaks.

Referring now again to FIG. 6, group envelope voltage $VG_{ENV}$ is provided to the negative input of a feedback component 60, such as a $g_m$ stage as discussed above. An amplitude reference signal is supplied to the positive input of feedback component 60. The output of feedback component 60 is connected in parallel to all of amplifiers 52 to control their gains. Feedback component 60 thus forms feedback that adjusts the amplifier gains as a function of the difference between group envelope voltage $VG_{ENV}$ and supplied amplitude reference $V_{AMP}$. More specifically, the feedback adjusts the amplifier gains to reduce or minimize the difference between group envelope voltage $VG_{ENV}$ and supplied amplitude reference $V_{AMP}$.

In accordance with the technique described with reference to FIG. 4, $V_{AMP}$ can be derived from a clock signal CLOCK that is used for timing transfer of information on data signals $D_{IN}$. A reference or clock envelope detector 62 receives the clock signal, which can be either a differential voltage signal or a non-differential voltage signal, and produces $V_{AMP}$ as a reference or clock envelope voltage. As already described, $V_{AMP}$ is used as feedback in combination with $VG_{ENV}$, so that the group envelope voltage is set to the approximate envelope voltage of clock signal CLOCK.

The multi-amplifier circuit of FIG. 6 is preferably duplicated for the data lines of each data group, data byte or data word, with the exception of clock envelope detector 62 whose output is used in common by all such circuits. Thus, within a single data byte or word, each signal line is subject to the same amplification. Furthermore, the gains applied to the respective data groups are adjusted so that their group envelopes match a common reference—in this case the envelope of the clock signal against which the data signals are timed.

This technique is a significant improvement over the prior art. Specifically, this circuit exhibits improved response in situations where a single data input might remain unchanged for a relatively long period. In prior art circuits, an individual envelope detector would have begun to decay during this period, and automatic gain control would have responded by inappropriately increasing the circuit gain. In the circuit of FIG. 6, however, this likelihood is reduced by a factor of N, where N is the number of data inputs that are collectively monitored by group envelope detector circuitry 54. Activity on any one of these inputs prevents the decay of the envelope voltage, and thus prevents the automatic gain control feedback from inappropriately increasing the circuit gain.

Furthermore, the techniques employed by the circuit of FIG. 6 minimize signal skew within data signals. In particular, the circuit of FIG. 6 results in the same gain being applied to all of the individual data lines of a data byte or data word. This minimizes line-to-line variations in signal skew, and accordingly increases the reliability of the signals. Byte-to-byte skew is also reduced by the technique of adjusting the gains of each byte to a common reference.

Figure 9:
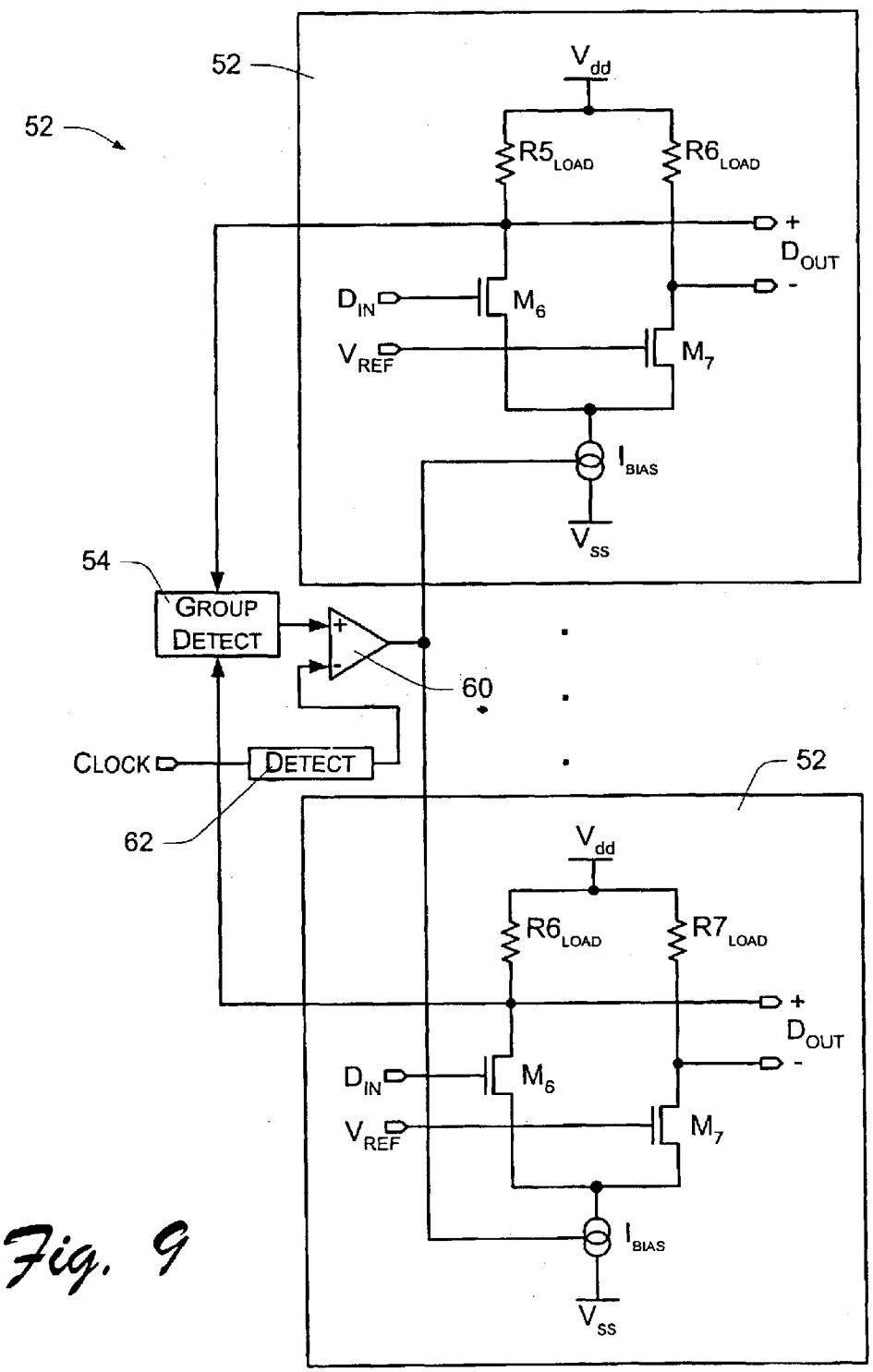
FIG. 9 is a schematic diagram of a receiver circuit employing group envelope detection techniques.

FIG. 9 shows the signal receiver 50 with specific implementations shown for individual amplifiers 52. These differential amplifiers are appropriate for use in conjunction with input data signals $D_{IN}$ that are specified relative to a relatively constant, intermediate, common reference voltage $V_{REF}$. In response to $D_{IN}$ and $V_{REF}$, each differential amplifier produces a differential voltage output signal $D_{OUT}$ having + and − outputs.

Each differential amplifier 52 comprises a differential pair of FET transistors $M_6$ and $M_7$ whose sources are connected in common. The drains of $M_6$ and $M_7$ form the high and low outputs of differential voltage output signal $D_{OUT}$, and are connected through respective loads $R5_{LOAD}$ and $R6_{LOAD}$ to a high supply voltage $V_{dd}$. The gates of $M_6$ and $M_7$ are connected respectively to $D_{IN}$ and $V_{REF}$. The sources of $M_6$ and $M_7$ are connected in common through a biasing current source $I_{BIAS}$ to a low supply voltage $V_{ss}$.

The group envelope detection circuitry is depicted in FIG. 9 as a single group envelope detector 54 that receives the positive side of differential $D_{OUT}$ from each amplifier 52. The output of group envelope detector 54 is connected to the positive input of feedback component 60. The circuit also includes clock envelope detector 62 whose output is connected to the negative input of feedback component 60. The output of feedback component 60 is connected in parallel to control the current sources $I_{BIAS}$ of the different amplifiers 52. Thus, the amplifiers are controlled to all have the same gain—a gain that produces a group envelope approximately equal to that of the clock signal CLOCK.

Figure 10:
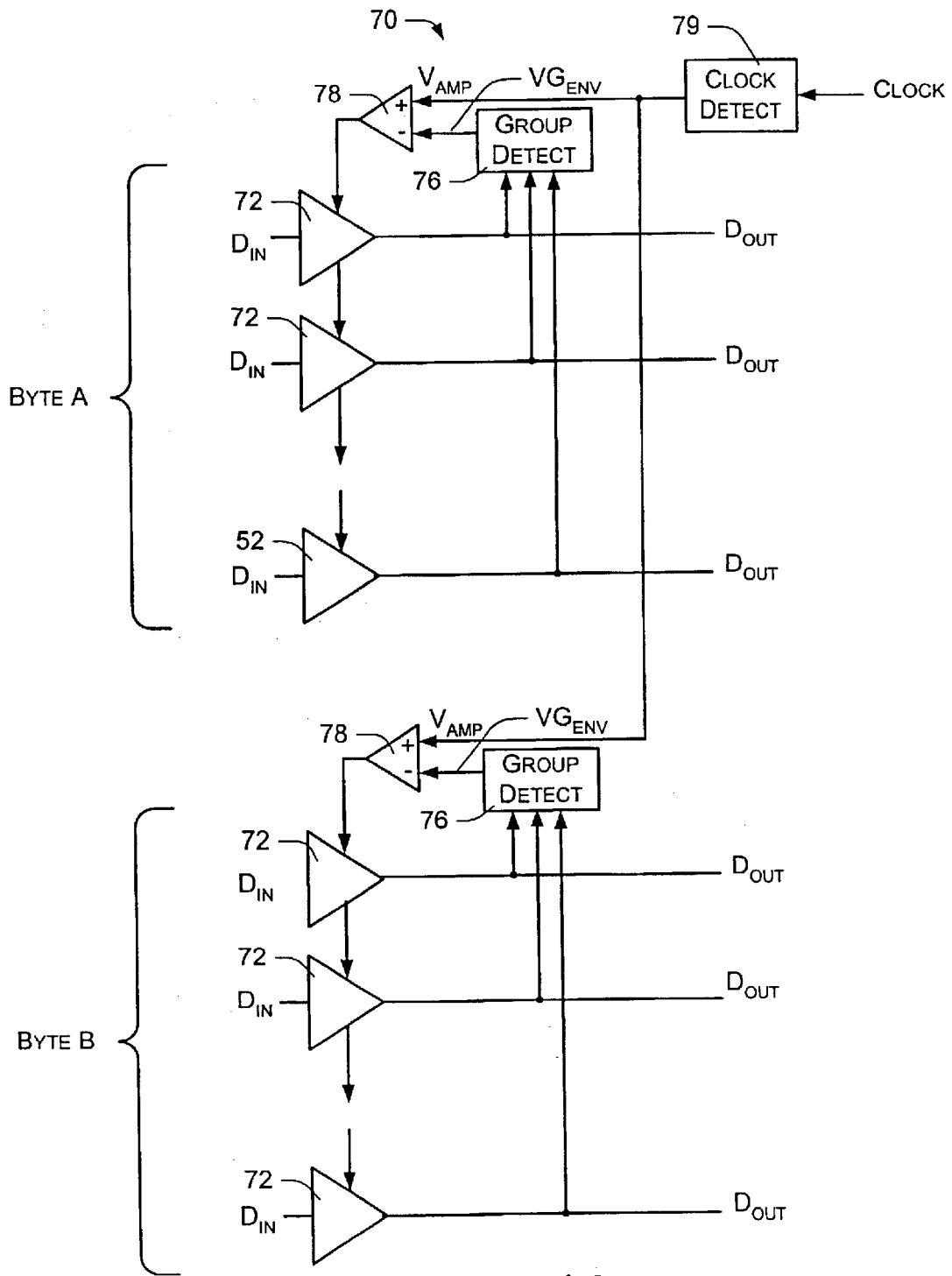
FIG. 10 is a schematic diagram illustrating group envelope detection applied to groups or bytes of data signals.

FIG. 10 shows yet another embodiment of a signal receiver, generally referenced by numeral 70. This embodiment is similar to that shown in FIG. 6, except that the data input signals $D_{IN}$ are segregated into groups such as data bytes or words. FIG. 10 shows two such groups: Byte A and Byte B.

Signal receiver 70 includes groups of amplifiers corresponding respectively to the groups of input signals $D_{IN}$. The amplifiers produce corresponding groups of amplified data signals $D_{OUT}$. The amplifiers have variable gains.

A group envelope detector 76 is associated with each group of amplified data signals $D_{OUT}$. Each group envelope detector is responsive to its associated group of amplified data signals $D_{OUT}$ to indicate a group envelope voltage $VG_{ENV}$ for that group of signals $D_{OUT}$. Group envelope detectors are implemented in accordance with the techniques already described.

Receiver 70 comprises feedback associated with each group of amplifiers. The feedback comprises a $g_m$ stage 78 that collectively adjusts the gains of the associated amplifiers as a function of the difference between the group envelope voltage $VG_{ENV}$ of the amplifiers and a supplied amplitude reference $V_{AMP}$.

In this embodiment, $V_{AMP}$ comprises the envelope or peak voltage of a clock signal with which data signals $D_{IN}$ are timed. Specifically, the receiver comprises a clock envelope detector 79 that receives clock signal CLOCK and that in response produces clock envelope voltage signal $V_{AMP}$. Each of feedback components 78 receives the same clock envelope voltage signal $V_{AMP}$.

Figure 3:
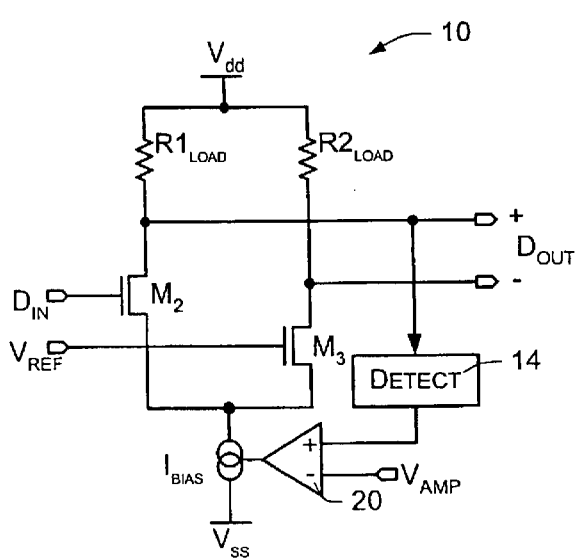
FIG. 3 is a schematic diagram of a prior art automatic gain control circuit.
Figure 11:
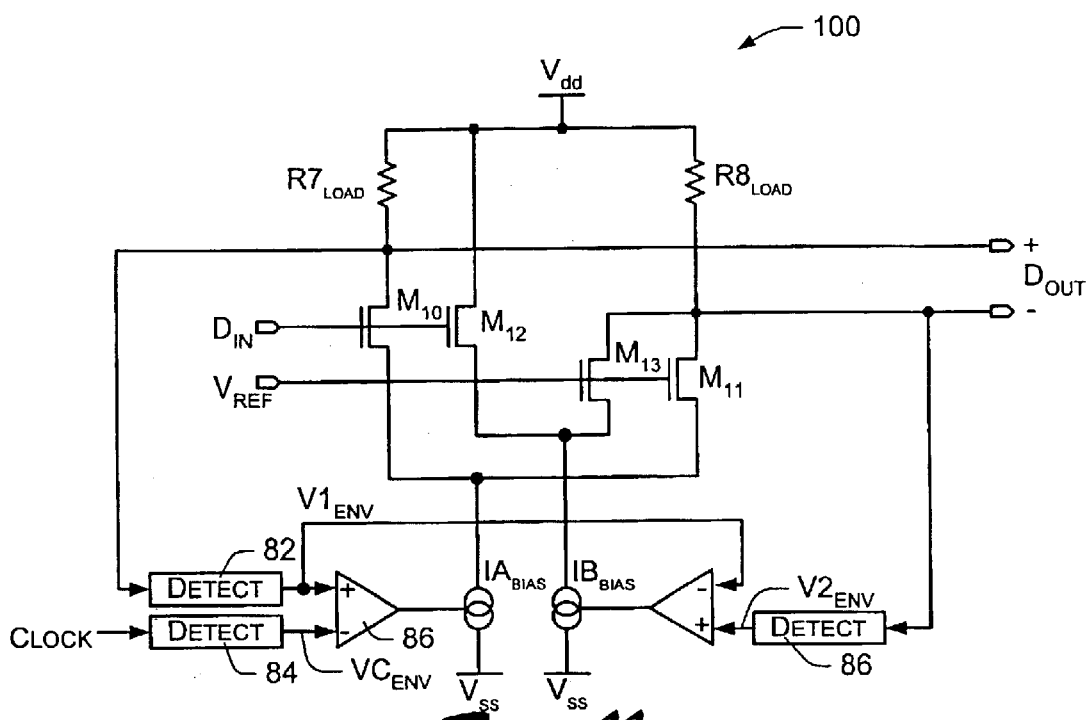
FIG. 11 is a schematic diagram illustrating techniques for correcting asymmetries in differential voltage output signals.

FIG. 11 illustrates a further technique that can be used to condition received data signals. The circuit shown in FIG. 11 addresses a problem that sometimes arises in amplifier circuits such as those shown in FIGS. 3, 5, and 9. These amplifiers accept differential inputs and produce differential outputs. However, the inputs $D_{IN}$ and $V_{REF}$ are not truly differential, in that $V_{REF}$ is actually a constant voltage while $D_{IN}$ varies above and below $V_{REF}$. This can cause asymmetries in the amplified output signals. These asymmetries become acute when supply voltages are reduced to achieve higher operating speeds, creating situations in which certain transistors fail to reach saturation.

Figure 12:
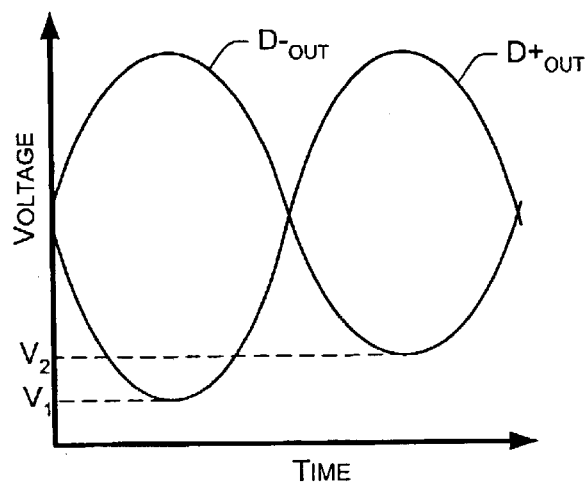
FIG. 12 is a graph illustrating asymmetries that can occur in prior art differential amplifier circuits.

FIG. 12 illustrates this anomaly, showing the voltage outputs of $D+_{OUT}$ and $D-_{OUT}$ in response to an oscillating input $D_{IN}$. It is apparent that the negative peak $V_1$ of $D+_{OUT}$ is significantly lower than the negative peak $V_2$ of $D-_{OUT}$. The circuit of FIG. 11 corrects this.

In the circuit of FIG. 11, a receiver 80 comprises a differential amplifier having two stages of amplification. A first amplification stage is similar to the double-ended differential amplifiers already discussed, being responsive to a data signal $D_{IN}$ and an intermediate reference voltage $V_{REF}$ to produce positive and negative differential output signals $D+_{OUT}$ and $D-_{OUT}$.

More specifically, the first amplification stage comprises a differential pair of transistors $M_{10}$ and $M_{11}$, corresponding loads $R7_{LOAD}$ and $R8_{LOAD}$, and a biasing current source referred to in FIG. 11 as $IA_{BIAS}$. The sources of transistors $M_{10}$ and $M_{11}$ are connected in common and through $IA_{BIAS}$ to lower supply voltage $V_{ss}$. The drains of transistors $M_{10}$ and $M_{11}$ are connected respectively through loads $R7_{LOAD}$ and $R8_{LOAD}$ to upper supply voltage $V_{dd}$. The gate of transistor $M_{10}$ is connected to data input signal $D_{IN}$, while the gate of transistor $M_{11}$ is connected to intermediate voltage reference $V_{REF}$. Transistors $M_{10}$ and $M_{11}$ produce an amplified differential voltage output signal $D_{OUT}$ comprising first and second output signals referred to as $D+_{OUT}$ and $D-_{OUT}$. The + component of $D_{OUT}$ is generated at the drain of transistor $M_{10}$. The − component of $D_{OUT}$ is generated at the drain of transistor $M_{11}$. The gain of the first amplification stage is adjustable by adjusting the magnitude of current produced by current source $IA_{BIAS}$.

Receiver 80 comprises a first envelope detector 82 whose input is connected receive one of the $D_{OUT}$ signals. Specifically, envelope detector is configured to detect the negative envelope or peaks of positive differential voltage signal $D+_{OUT}$ and to create a first envelope voltage $V1_{ENV}$ indicating the negative envelope of $D+_{OUT}$.

The receiver 80 comprises feedback, associated with the described first amplification stage, to adjust the gain of the first amplification stage to reduce the difference between the first envelope voltage $V1_{ENV}$ and a supplied reference voltage. As discussed above, the supplied reference voltage is preferably the detected envelope voltage $VC_{ENV}$ of a related clock signal. As shown in FIG. 11, clock signal CLOCK is received by an envelope detector 84 to produce the reference voltage $VC_{ENV}$.

The feedback associated with the first amplification stage comprises a $g_m$ amplification stage or feedback component 86 whose output is connected to control current source $IA_{BIAS}$. The feedback adjusts the current through the first amplification stage so that the negative envelope of $D+_{OUT}$ is approximately equal to the negative envelope of clock signal CLOCK. This adjustment affects both of the differential outputs $D+_{OUT}$ and $D-_{OUT}$, although the negative envelope of the $D-_{OUT}$ signal potentially exhibits the anomaly described with reference to FIG. 12.

Receiver 80 further comprises a second, singled-ended amplification stage that affects the two differential outputs $D+_{OUT}$ and $D-_{OUT}$ unequally. Specifically, this second amplification stage affects only the negative, $D-_{OUT}$ output of the differential output pair.

The second amplification stage comprises a differential pair of transistors $M_{12}$ and $M_{13}$. The gate of $M_{12}$ is controlled by $D_{IN}$ and the gate of $M_{13}$ is controlled by $V_{REF}$. The sources of these two transistors are tied in common and through a supplemental current source $IB_{BIAS}$ to the lower supply voltage $V_{ss}$. The drain of transistor $M_{13}$ is connected to negative differential output $D-_{OUT}$. However, the drain of transistor $M_{12}$ is connected directly to upper supply voltage $V_{dd}$. Thus, this stage of amplification affects only negative differential output $D-_{OUT}$. The gain of this amplification stage is adjustable, and is controlled by current source $IB_{BIAS}$.

The circuit further comprises a second envelope detector 88 that is responsive to the negative differential output signal $D-_{OUT}$ to produce a second envelope voltage $V2_{ENV}$ reflecting the negative envelope or peaks of negative differential output signal $D-_{OUT}$. A $g_m$ stage or feedback component 90 is responsive to the $V1_{ENV}$ and $V2_{ENV}$ to adjust the gain of the second amplification stage. Specifically, this feedback is configured to adjust the gain of the second amplification stage to minimize the difference between the first and second envelope voltages $V1_{ENV}$ and $V2_{ENV}$.

The two amplification stages, and the feedback associated with each amplification stage, effectively adjust both the positive and negative components of $D_{OUT}$ to have amplitudes matching that of the clock signal CLOCK, and correct for the asymmetrical differential output illustrated in FIG. 12.

Figure 13:
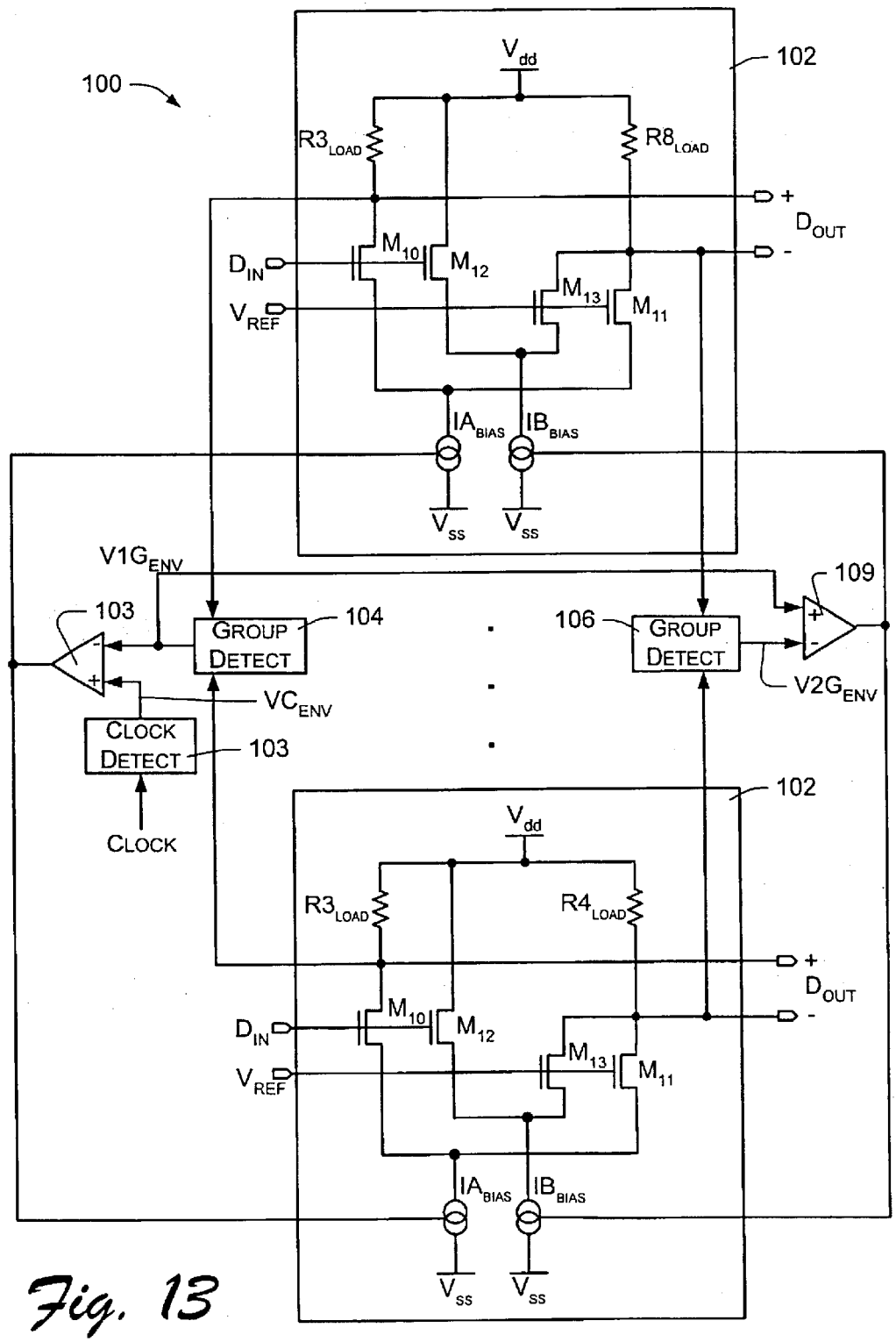
FIG. 13 is a schematic diagram illustrating the use of a plurality of differential amplifiers such as the one shown in FIG. 11.

Although FIG. 12 shows a receiver that receives only a single data signal, the techniques shown in FIG. 13 can be used effectively in a receiver that receives a plurality of signals. FIG. 13 shows such a receiver 100.

In FIG. 13, receiver 100 includes a plurality or group of signal receivers 102 such as described above with reference to FIG. 11. Each signal receiver corresponds to and receives a single data input signal $D_{IN}$, and in response produces a differential voltage output data signal $D_{OUT}$. Each receiver has a first amplification stage that affects both the positive and negative components $D+_{OUT}$ and $D-_{OUT}$ of the differential output. Each receiver also has a second amplification stage that affects the first and second differential voltage data signals unequally. Specifically, the second amplification stage of each receiver affects only the negative, $D-_{OUT}$ differential output signal.

Receiver 100 includes a clock envelope detector 103 that is responsive to a differential voltage clock signal to indicate a clock envelope voltage $VC_{ENV}$. In is this embodiment, the envelope detector is configured to detect the negative envelope or peaks of the clock signal CLOCK.

Receiver 100 also includes first and second group envelope detectors 104 and 106. These detectors are like the group detectors previously discussed with reference to FIGS. 7 and 8, in that each detector is responsive to a collection of signals to produce an envelope signal representing the most extreme envelope of the collection or to produce an average of the envelopes of the signals. In this embodiment, these envelope detectors are configured to detect the negative envelopes or peaks of the respective signals.

More specifically, first group envelope detector 104 is responsive to the collective positive differential voltage signals $D+_{OUT}$ to indicate a first group envelope voltage $V1G_{ENV}$. Second envelope detector 106 is responsive to the collective negative differential voltage signals $D-_{OUT}$ to indicate a second group envelope voltage $V2G_{ENV}$.

Receiver 100 includes two feedback components 108 and 109. A first feedback component or $g_m$ stage 108 is configured to adjust the gain of the first amplification stages of the individual signal receivers 102 to reduce or minimize the difference between the first group envelope voltage $V1G_{ENV}$ and the clock envelope voltage $VC_{ENV}$. A second feedback component or $g_m$ stage 109 is configured to adjust the gain of the second amplification stages of the individual signal receivers 102 to reduce or minimize the difference between the first group envelope voltage $V1G_{ENV}$ and the second group envelope voltage $V2G_{ENV}$.

The various exemplary embodiments described above illustrate the use of real-time feedback to match both individual and group envelope voltages. Specifically, the described envelope detection circuitry operates continuously to indicate group envelope voltages, and the AGC feedback similarly operates in a continuous mode in response to varying group envelope voltages. This is appropriate in many situations, and especially in situations where point-to-point data signaling is used. Such real-time feedback might not be appropriate in other situations, however, especially those in which data might be received from a plurality of different senders. In situations such as this, it might be more appropriate to determine gains during calibration procedures performed while receiving data from the different senders.

Figure 14:
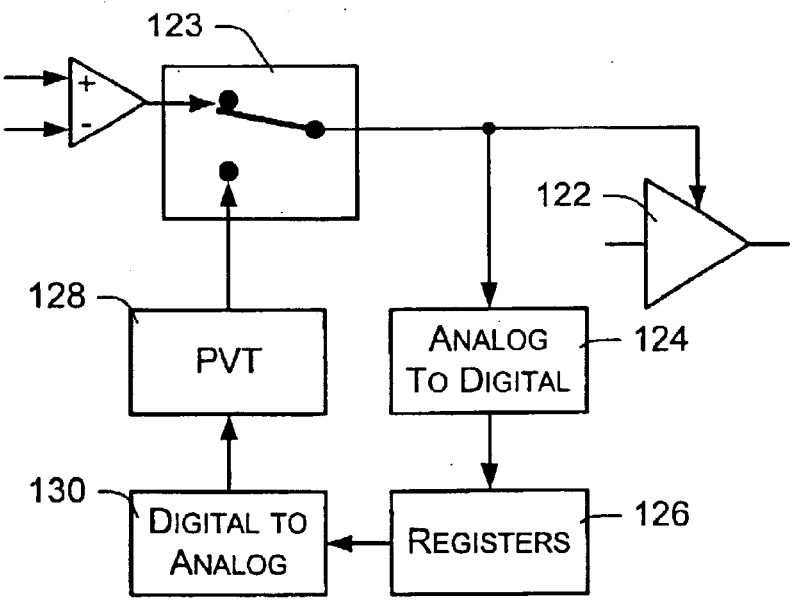
FIG. 14 is a schematic diagram illustrating circuits for operating the previously discussed circuits in situations where gains are calibrated in calibration procedures and stored for later use when receiving signals from different senders.

FIG. 14 shows pertinent components to implement an initialization procedure to determine appropriate gains for use when receiving signals from different senders. AGC feedback component 120 operates as described above with reference to received individual or group envelope signals and produces an output that adjusts the gain of an amplifier 122. A switching circuit 124 is configured during the initialization procedure to supply the output of the AGC feedback component 120 to the gain control input of amplifier 122. During initialization, an appropriate data pattern is transmitted from the sending device and the AGC feedback is allowed to reach a steady state. An analog-to-digital converter 124 samples the voltage output of feedback component 120 and converts it to a digital value. This value is stored in storage elements or registers 126. This procedure is repeated for different senders, and a gain value is stored for each sender.

During subsequent, normal operation, switching circuit 124 is configured to supply a voltage produced by a digital-to-analog converter 128. Digital-to-analog converter 128 receives its input from storage elements 126, which are controlled to output a value that corresponds to the particular sending device that is currently active.

Optionally, PVT (process, voltage, and temperature) correction can be performed on the data before it is provided to digital-to-analog converter 128, as shown by PVT correction component 130.

FIG. 15 shows an example of a $g_m$ stage such as used in the circuits described above, generally designated in FIG. 15 by reference numeral 200. The $g_m$ stage is preferably implemented digitally, so that PVT compensation and calibration can be more easily accomplished.

The $g_m$ stage 200 includes a comparator 202 that receives a reference signal and a feedback signal. The comparator produces a positive or "true" output signal when the voltage of the feedback signal is lower than that of the reference signal, and a negative or "false" output signal when the voltage of the feedback signal is higher than that of the reference signal.

Figure 15:
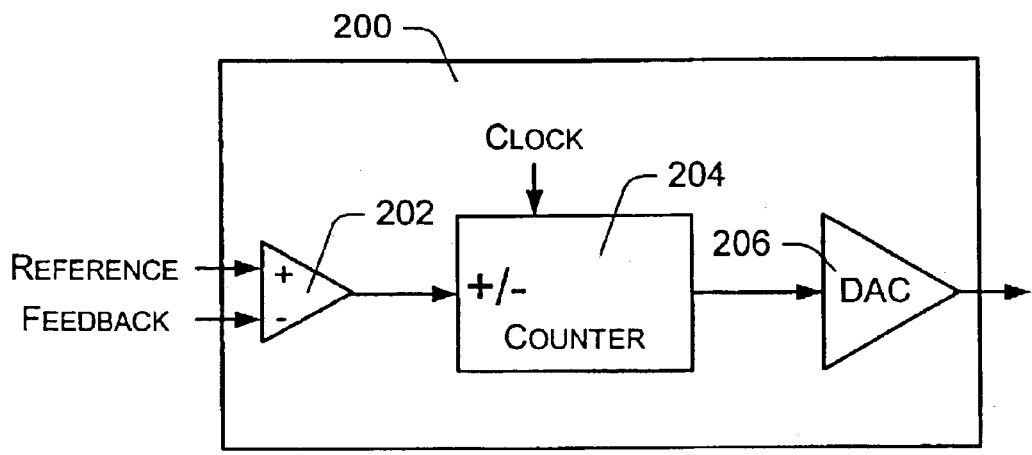
FIG. 15 is a schematic diagram of a $g_m$ stage suitable for use in the embodiments described above.

A digital counter 204 receives the output of comparator 202 at its increment/decrement input, labeled "+/−" in FIG. 15 Counter 204 is clocked at a chosen frequency, and produces a digital output that varies as a function of the output of comparator 202. If the output of comparator 202 is positive, the counter increments its output at every clock cycle. If the output of comparator is negative, the counter decrements its output at every clock cycle. In many embodiments, it may be desirable to filter the signal from comparator 202 to reduce jitter. For example, the circuit might be configured to require that the output of comparator 202 remain stable for a number of consecutive clock cycles before it is considered valid, or before counter 204 will respond to it. "Majority" filtering might alternatively be used, wherein a number of consecutive samples are collected and the majority value of the samples is used as the filtered output.

The digital output of counter 204 is received by a digital-to-analog converter (DAC) 206, where it is converted to an analog output signal.

This circuit produces an analog output voltage that varies in response to the reference and feedback signals. At equilibrium, the output voltage will be such that the reference and feedback signals are approximately equal, assuming that the feedback signal is related in some positive manner to the output voltage.

The circuits and techniques describe above provide improvements in automatic gain control. By collectively adjusting the gains of each data byte or word, I/O line-to-line skew is minimized. Mismatches between the signal lines of different bytes are minimized by adjusting different bytes or words to a common reference. Furthermore, the techniques can be generalized to match the group envelope of one type of data to the group envelope of some other type of data.

Although details of specific implementations and embodiments are described above, such details are intended to satisfy statutory disclosure obligations rather than to limit the scope of the following claims. Thus, the invention as defined by the claims is not limited to the specific features described above. Rather, the invention is claimed in any of its forms or modifications that fall within the proper scope of the appended claims, appropriately interpreted in accordance with the doctrine of equivalents.

What is claimed is:

1. A signal receiver that receives a data signal, wherein the data signal is timed relative to a clock signal, comprising:
   an amplifier that receives the data signal and that produce a corresponding amplified data signal, the amplifier having a variable gain;
   signal envelope detection circuitry responsive to the amplified data signal to indicate an amplified signal envelope voltage;
   clock envelope detection circuitry responsive to the clock signal to indicate a clock envelope voltage; and
   feedback configured to adjust the gain of the amplifier as a function of the difference between the indicated amplified signal envelope voltage and the indicated clock envelope voltage.

2. A signal receiver as recited in claim 1, wherein the clock signal is a differential voltage signal.

3. A signal receiver as recited in claim 1, wherein the clock signal is a differential voltage signal and the data signal is a non-differential voltage signal.

4. A signal receiver as recited in claim 1, wherein the clock signal is a differential voltage signal and the data signal is a non-differential voltage signal that varies relative to an intermediate reference voltage.

5. A signal receiver as recited in claim 1, wherein:
   the clock signal is a differential voltage signal;
   the data signal is a non-differential voltage signal that varies relative to an intermediate reference voltage;
   the amplifier is a differential amplifier that produces a differential voltage output in response to the data signal and the intermediate reference voltage.

6. A signal receiver as recited in claim 1, wherein the feedback adjusts the amplifier to reduce the difference between the indicated amplified signal envelope voltage and the indicated clock envelope voltage.

7. A signal receiver as recited in claim 1, wherein the feedback operates in real time to adjust the amplifier gain.

8. A signal receiver as recited in claim 1, wherein the feedback operates during an initialization procedure to determine amplifier gains for use when receiving data signals from different senders, further comprising one or more storage elements that store values indicating the determined amplifier gains.

9. A signal receiver that receives a reference voltage and a data signal, wherein the data signal varies about the reference voltage, comprising:
   a first amplification stage that is responsive to the reference voltage and the data signal to produce a differential pair of first and second output signals;
   a first envelope detector that is responsive to the first output signal to indicate a first envelope voltage;
   a second amplification stage that affects the first and second output signals unequally;
   a second envelope detector that is responsive to the second output signal to indicate a second envelope voltage; and
   feedback configured to adjust the gain of the second amplification stage as a function of the difference between the indicated first and second envelope voltages.

10. A signal receiver as recited in claim 9, wherein the feedback adjusts the gain of the second amplification stage to reduce the difference between the indicated first and second envelope voltages.

11. A signal receiver as recited in claim 9, wherein the second amplification stage affects only the second output signal.

12. A signal receiver as recited in claim 9, the first amplification stage having an adjustable gain, further comprising feedback configured to adjust the gain of the first amplification stage to reduce the difference between the first envelope voltage and a supplied reference.

13. A signal receiver as recited in claim 9, wherein the data signal is timed relative to a clock signal and the first amplification stage has an adjustable pain, further comprising:
   a clock envelope detector that is responsive to the clock signal to indicate a clock envelope voltage; and feedback configured to adjust the gain of the first amplification stage to reduce the difference between the first envelope voltage and the clock envelope voltage.

14. A signal receiver as recited in claim 9, wherein the first amplification stage affects both the first and second output signals.

15. A signal receiver as received in claim 9, wherein:
the first amplification stage comprises:
a first pair of transistors connected in common to a first current source and controlled respectively by the data signal and the reference voltage;
a pair of loads associated respectively with each of the first pair of transistors;
the second amplification stage comprises:
a second pair of transistors connected in common to a second current source and controlled respectively by the data signal and the reference voltage; and
a load associated with only one of the second pair of transistors.

16. A data receiver that receives a plurality of data signals that are specified relative to an intermediate reference voltage, comprising:
a group of signal receivers that receive the data signals and that produce corresponding first and second differential voltage data signals in response;
a first group envelope detector responsive to the collective first differential data signals to indicate a first group envelope voltage;
a second group envelope detector responsive to the collective second differential data signals to indicate a second group envelope voltage;
each of the signal receivers having a single-end amplification stage that affects the first and second differential voltage data signals unequally; and
feedback configured to adjust the gain of the single-end amplification stages of the signal receivers as a function of the first and second group envelope voltages.

17. A data receiver as recited in claim 16, wherein single-end amplification stage affects only the second differential voltage data signal.

18. A data receiver as recited in claim 16, wherein the feedback adjusts the gain of the single-end amplification stage to reduce the difference between the indicated first and second group envelope voltages.

19. A data receiver as recited in claim 16, wherein the single-end amplification stage comprises a pair of transistors connected in common to a current source and controlled respectively by the data signal and the intermediate reference voltage.

20. A data receiver that receives a plurality of data signals that are specified relative to an intermediate reference voltage and that are timed relative to a differential voltage clock signal, comprising:
a group of signal receivers that receive the data signals;
each of the signal receivers having a first amplification stage that produces first and second differential voltage data signals in response to one of the received data signals and the intermediate reference voltage, the first amplification stages having adjustable gains;
each of the signal receivers having an second amplification stage that affects the first and second differential voltage data signals unequally, the second amplification stages having adjustable gains;
first group envelope detector responsive to the collective first differential voltage data signals to indicate a first group envelope voltage;
a second group envelope detector responsive to the collective second differential data signals to indicate a second group envelope voltage;
a clock envelope detector responsive to the differential voltage clock signal to indicate a clock envelope voltage;
first feedback configured to adjust the gain of the first amplification stages of the signal receivers to reduce the difference between the first group envelope voltage and the clock envelope voltage; and
second feedback configured to adjust the gain of the second amplification stages of the signal receivers to reduce the difference between the indicated first and second group envelope voltages.

21. A data receiver as recited in claim 20, wherein adjusting the gain of the first amplification stage affects both of the first and second differential voltage data signals.

22. A data receiver as recited in claim 20, wherein adjusting the gain of the second amplification stage affects only the second differential voltage data signal.

23. A data receiver as recited in claim 20, wherein:
adjusting the gain of the first amplification stage affects both of the first and second differential voltage data signals;
adjusting the gain of the second amplification stage affects only the second differential voltage data signal.

* * * * *

UNITED STATES PATENT AND TRADEMARK OFFICE
CERTIFICATE OF CORRECTION

PATENT NO. : 6,727,759 B2
DATED : April 27, 2004
INVENTOR(S) : Nguyen et al.

It is certified that error appears in the above-identified patent and that said Letters Patent is hereby corrected as shown below:

Column 12,
Line 64, replace "pain" with -- gain --.

Column 14,
Line 16, insert -- a -- before "first".

Signed and Sealed this

Ninth Day of November, 2004

JON W. DUDAS
*Director of the United States Patent and Trademark Office*